(12) United States Patent
Moden et al.

(10) Patent No.: US 6,709,893 B2
(45) Date of Patent: Mar. 23, 2004

(54) INTERCONNECTIONS FOR A SEMICONDUCTOR DEVICE AND METHOD FOR FORMING SAME

(75) Inventors: Walter L. Moden, Boise, ID (US); Larry D. Kinsman, Boise, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/015,337

(22) Filed: Dec. 11, 2001

(65) Prior Publication Data

US 2002/0041034 A1 Apr. 11, 2002

Related U.S. Application Data

(62) Division of application No. 09/076,344, filed on May 11, 1998, now Pat. No. 6,329,709.

(51) Int. Cl.[7] .......................... H01L 21/44; H01L 21/48; H01L 21/50
(52) U.S. Cl. .................... 438/113; 438/110; 438/127
(58) Field of Search ................. 438/106, 107, 438/110, 113, 125–127; 257/690, 701, 730, 784, 787, 791–793

(56) References Cited

U.S. PATENT DOCUMENTS

| | | | | |
|---|---|---|---|---|
| 4,515,480 | A |   | 5/1985 | Miller et al. ............... 356/400 |
| 5,107,325 | A | * | 4/1992 | Nakayoshi ................. 257/793 |
| 5,134,462 | A |   | 7/1992 | Freyman et al. .......... 257/688 |
| 5,360,992 | A |   | 11/1994 | Lowrey et al. ........... 257/666 |
| 5,593,927 | A |   | 1/1997 | Farnworth ................. 437/209 |
| 5,710,062 | A | * | 1/1998 | Sawai et al. ............... 438/127 |
| 5,824,569 | A | * | 10/1998 | Brooks et al. ............ 438/127 |
| 5,856,212 | A | * | 1/1999 | Chun ......................... 438/126 |
| 5,950,072 | A | * | 9/1999 | Queyssac .................. 438/118 |
| 6,083,838 | A |   | 7/2000 | Burton et al. ............. 438/691 |

FOREIGN PATENT DOCUMENTS

JP            9-134982            5/1997

* cited by examiner

Primary Examiner—Jamie Brophy
(74) Attorney, Agent, or Firm—Kevin D. Martin

(57) ABSTRACT

A method for forming an electrical contact for a semiconductor device comprises the steps of providing a semiconductor wafer section having a major surface with a plurality of conductive pads thereon and electrically coupling each pad with an elongated electrical interconnect. Next, each electrical interconnect is encased in a dielectric and the dielectric is sectioned to expose a portion of each interconnect. An inventive structure which can be formed by the inventive method is also described.

25 Claims, 2 Drawing Sheets

INTERCONNECTIONS FOR A SEMICONDUCTOR DEVICE AND METHOD FOR FORMING SAME

This application is a division of Ser. No. 09/076,344 filed May 11, 1998 now U.S. Pat. No. 6,329,709.

FIELD OF THE INVENTION

This invention relates to the field of semiconductor assembly, and more particularly to an interconnection method and structure for a semiconductor device.

BACKGROUND OF THE INVENTION

A semiconductor device in its most common form comprises a semiconductor die having bond pads thereon, a lead frame mechanically connected with the die, bond wires which electrically couple the bond pads with lead fingers of the lead frame, and encapsulation material which surrounds the die, the bond wires, and the majority of the lead frame. The device is electrically coupled with a printed circuit board (PCB) by soldering leads of the lead frame with pads on the PCB.

While increasing the speed and improving the reliability of components such as microprocessors, memory, and logic devices are goals of designers, the design described above has elements that are contrary to optimal component speed and reliability. For example, each bond wire is connected at two points, one connection to a bond pad and one connection to a lead finger of the lead frame. These connections are subject to separation, for example from pressure exerted on the bond wire during the encapsulation process resulting from lead sweep. Further, the connection may be adequate during testing but the bond wire can separate from the die or the lead frame during shipment or while in use from various failure mechanisms. Finally, the signal path provided by conventional package designs is relatively long which decreases signal speed and integrity and thereby increases the signal delay.

Another source of malfunction for semiconductor devices is the mechanical attachment between the die and the lead frame. The die rests on a die paddle in a typical package or is attached to lead fingers overlying the die in a leads-over-chip package. In either case separation of the die from the lead frame can occur, for example from thermal mismatch between the silicon die and the metal lead frame which stresses an attachment material that mechanically connects the die with the lead frame.

Another disadvantage of the design described above is that while it can be manufactured to produce a relatively thin package, for example in a thin small outline package (TSOP), an encapsulated semiconductor device requires a relatively large surface area of the PCB onto which it is installed. As miniaturization of electronics is typically a design goal, the semiconductor device described above does not lend itself to providing a small assembly.

A method and structure for providing an interconnection for communication with a semiconductor device which reduces or eliminates the problems described above would be desirable.

SUMMARY OF THE INVENTION

The present invention provides a new method and structure which reduce problems associated with the manufacture of semiconductor devices, particularly problems resulting from poor bond wire connections and problems associated with lead frames. In accordance with one embodiment of the invention, a semiconductor device is provided which comprises a semiconductor wafer section (which can include an entire wafer or a portion thereof) having a major surface with a plurality of conductive pads thereon and a plurality of elongated electrical interconnections having first and second ends. The first end of each interconnection is formed to contact one of the pads. The device further comprises a dielectric encasing the electrical interconnections wherein at least a portion of the major surface is encased in dielectric. The second end of each the electrical interconnection is free from dielectric.

The end which is free from dielectric provides a contact point for attachment to an electronic device, for example through a printed circuit board. Thus the lead frame is eliminated and the interconnection which contacts the bond pad can be directly electrically coupled with the printed circuit board.

Objects and advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Figure 1:
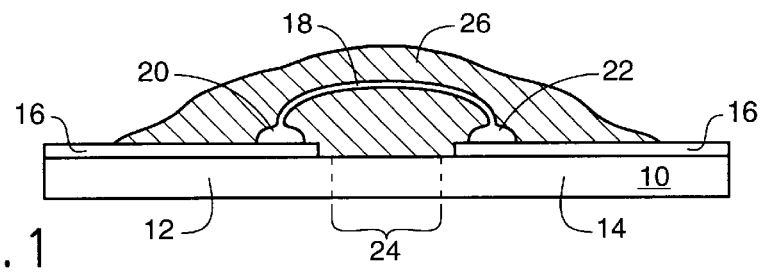
FIG. 1 is a cross section depicting an in-process structure comprising a wafer section having an interconnect encased in dielectric.

A first step of an inventive method for forming an electrical contact for a semiconductor device comprises the structure of FIG. 1 which depicts an in-process semiconductor wafer section (which can include a entire wafer or a portion thereof) 10 with at least a first 12 and a second 14 unsingularized semiconductor die. In other embodiments a single singularized semiconductor die could be used in place of the wafer section depicted. In the FIG. 1 embodiment the first and second die comprise a plurality of conductive pads 16 on a major surface of each die. Each element 16 as depicted includes a conductive line which attaches to other locations on the die. Only one pad is depicted on each die in FIG. 1 although each die will likely comprise a plurality of pads.

Next, each pad 16 is electrically coupled with an elongated electrical interconnect such as the bond wire 18 depicted, tape automated bonds, or other workable interconnection structures. In FIG. 1, one end 20 of bond wire 18 is attached to a bond pad 16 on the first die 12, and the other end 22 is attached to a bond pad 16 of the second die 14. Thus the bond wire 18 spans or bridges a saw kerf 24 or "street" area between the two adjacent unsingularized die 12, 14. Wire bonding can include the ball bonds depicted, wedge bonds, or other workable connection methods. As an exemplary embodiment, the bond wire can be a conventional gold-aluminum alloy wire 1.0 mil to 1.2 mils in diameter, or it can be enlarged to about 2.0 mils to 4.0 mils to allow for an increased contact surface area. A bond wire from about 10 to 20 mils in length would allow for a controllable loop height.

The electrical interconnect 18 is then encased in a dielectric material 26 such as polyimide, "glob top" material such as a liquid epoxy encapsulant, a room-temperature vulcanizing (RTV) rubber, a photoimagable polymer such as benzocyclobutene (BCB), a silicone gel, or other workable materials. Ideal properties of the dielectric used for this embodiment include a material which is electrically nonconductive, thermally conductive, noncorrosive, which has a thermal coefficient of expansion compatible with silicon, and which adheres well to the interconnect and to the wafer section. The dielectric 26 can cover only the interconnect 18 and the area of the wafer section immediately surrounding the interconnect as depicted in FIG. 1, or the dielectric can be formed over the entire surface of the wafer section or over a portion of the wafer section. To form the dielectric 26 only on the interconnect 18 and surrounding area or over only a portion of the wafer section, possible means of dispensing the dielectric include screen printing, syringe dispensing, stenciling, and thick spin coating. To form the dielectric over the entire surface of the wafer section, a fence can be formed around the perimeter of the wafer section such as is done during conventional glob top manufacturing to contain the dispensed dielectric. Alternately, a spun-on coat of dielectric such as spun-on glass can be formed, or a meniscus thick film coat of polymeric epoxy resin such as EPON® Resin SU-8 available from Shell Chemical Co. of Houston, Tex. can be used. The dielectric can thus serve a second use as a passivation layer for the remaining circuitry on the surface of the wafer section. To minimize the thickness of the device and to reduce temperature problems the dielectric should be just thick enough to cover and adequately protect the interconnect. Using a structure having a bond wire height of 4 mils, a dielectric thickness of about 6 mils would be sufficient.

Figure 2:
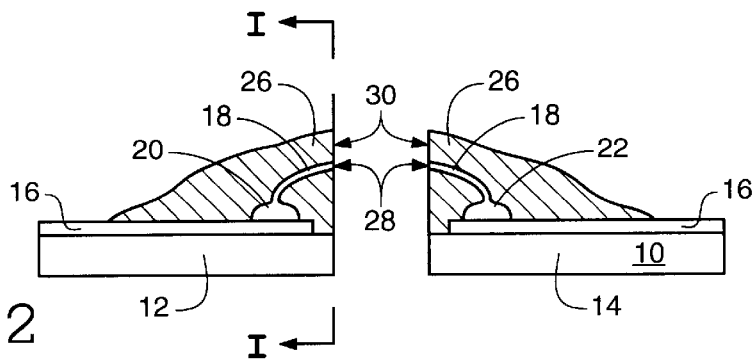
FIG. 2 is a cross section of the FIG. 1 structure after sectioning.
Figure 3:
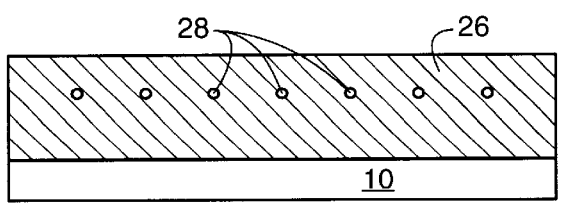
FIG. 3 is a cross section depicting an end view along I—I of the FIG. 2 structure.

Next, the structure of FIG. 1 is sectioned to sever the interconnects which results in the structure depicted in FIGS. 2 and 3 to form electrical contacts. FIG. 3 depicts the FIG. 2 structure along I—I. Sectioning of the FIG. 1 structure can performed by cutting the structure, including the wafer section, the interconnects, and the dielectric, with a wafer saw, by chemical or mechanical etching, by using a water jet, or any other workable means. Alternately, one or more of the wafer section, the interconnects, and the dielectric can be sectioned separately.

During sectioning of the dielectric 26, the interconnects 18, and the wafer section 10, a portion of each interconnect 18 is exposed as depicted in FIG. 3 which depicts ends 28 of several interconnects 18, each of which is connected within the dielectric 26 to a bond pad 16. FIG. 2 depicts a planar face 30 of the dielectric 26 intersecting the wafer section 10 at a right angle, although it is conceivable that the FIG. 1 structure can be sectioned at other angles depending on the eventual use of the device.

Figure 4:
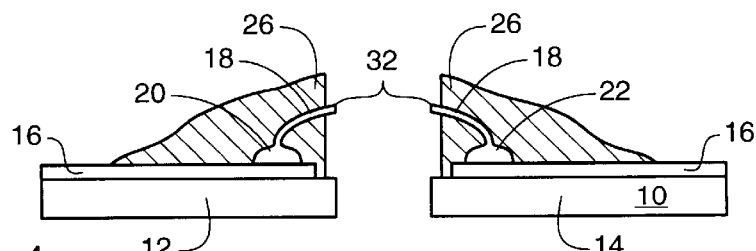
FIG. 4 is a cross section of another embodiment depicting protruding interconnections.

The severed interconnects can be flush with the dielectric as depicted in FIGS. 2 and 3, or the dielectric can be overetched away from the interconnects to provide protruding electrical interconnects which may facilitate connection therewith. Protruding interconnects 32 are depicted in FIG. 4. The ends 32 can be heated to form more rounded contacts, or they can be otherwise formed into a desired shape to facilitate electrical interconnection therewith. If flush as depicted in FIG. 2, the interconnect 18 has a generally planar surface and is generally coplanar with a generally planar surface of the dielectric as depicted in FIG. 2.

If chemical etching is used to section the assembly, a different etchant can be used to section the dielectric, the interconnects, and the wafer section. For example, the wafer, and possibly the dielectric depending the material used, can be etched with a solution of potassium hydroxide and water at 80° C. If a polyimide is used as the dielectric, hydrazine or an oxygen plasma can be used to etch the polyimide.

Connection to the exposed ends can then be made directly with any available means, for example using solder, z-axis conductive films or epoxies, wire bonds, flip-chip connections or mechanical touch contacts.

Figure 5:
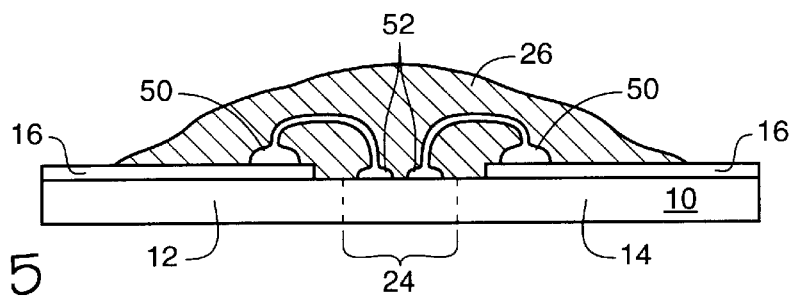
FIG. 5 is a cross section depicting a second embodiment of an in-process structure having a pair of bond wires bonded to a kerf area of a wafer section.
Figure 6:
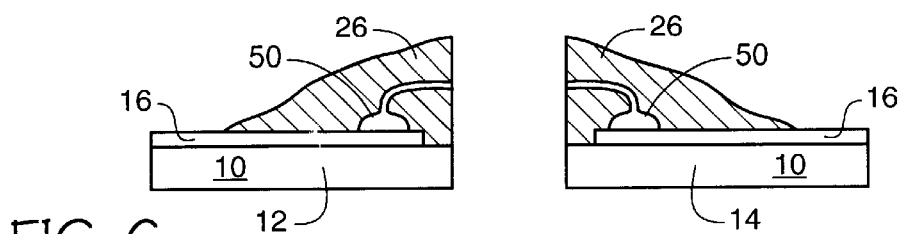
FIG. 6 is a cross section of the FIG. 5 structure after sectioning.

FIG. 5 depicts another embodiment of the invention before sectioning. In this embodiment a first end of each bond wire 50 is connected with a bond pad 16 of one of the unsingularized die 12, 14, and a second end 52 of each bond wire is connected to the street area of the wafer section. The FIG. 5 embodiment depicts two adjacent wire bonds in the street area 24, although a narrower street and thus more die on each wafer can be manufactured if the wire bonds are offset and aligned down the middle of the saw kerf. Thus the space required for the kerf 24 would be determined by the width required by the wafer saw or by the area required to chemically or mechanically etch the assembly during sectioning. With the structure of FIG. 5, the bond pads 16 can be manufactured further from the kerf area to allow for a bond wire with sufficient length for loop control. FIG. 6 depicts the resulting halves of the FIG. 5 structure after sectioning.

Figure 7:
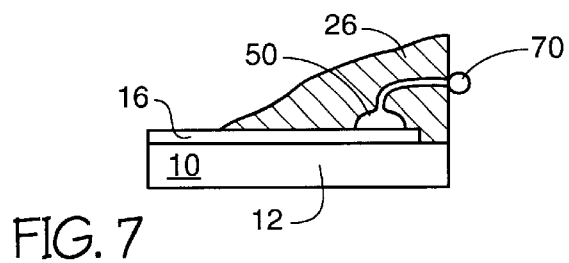
FIG. 7 is a cross section of an embodiment comprising the use of a solder ball to increase the interconnect surface area.

FIG. 7 depicts a sectioned structure after the addition of a solder ball 70 that can be used to increase or improve the contact area to the severed bond wire. The solder ball can comprise a gold-tin alloy, a tin-lead alloy, or an alloy of tin-lead-gold. The solder ball can be preformed by a manner similar to that used during the assembly of fine ball grid arrays (FBGA's) or the solder ball can be plated to the exposed ends of the bond wires.

Figure 8:
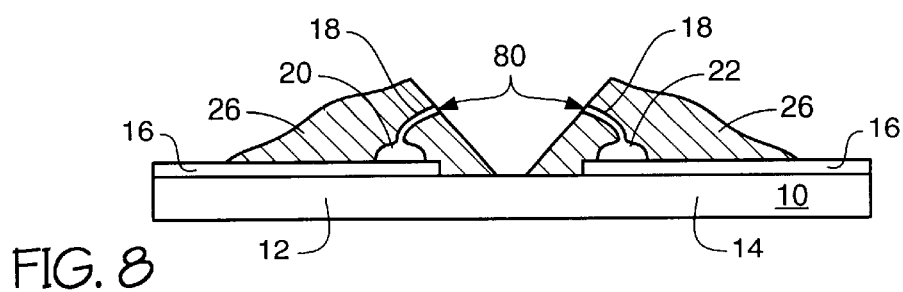
FIG. 8 is a cross section depicting the FIG. 1 embodiment with an angled cut of the dielectric which increases the exposed interconnect surface area.

FIG. 8 depicts an assembly having the dielectric 26 and interconnect 18 sectioned at an angle which increases the surface area of the exposed ends 80 of the interconnect which aids connection therewith. Forming an angled face in the dielectric for connection with a printed circuit board can also be advantageous depending on the eventual use of the die. Angling the dielectric and the cut of the interconnect can be accomplished by first using an angled blade to section the dielectric and the interconnects and to form a bevel in the dielectric and on the interconnects. A different blade such as a conventional wafer saw can then be used to slice and singularize the wafer sections. Alternately, a single blade may be machinable which can section the dielectric and the interconnect on an angle and slice the wafer section vertically with a single pass of the saw.

In another embodiment, the dielectric 26 and the exposed ends of the interconnects can be coated with a conductive material to increase the size of the area to which electrical contact can be made. For example, the dielectric and exposed portions of the interconnects can be sputtered with metal, masked, and etched to form pads which contact the interconnects. Further, a conductive epoxy or paste can be formed on the dielectric and on the exposed ends of the interconnect by means including screen printing, stenciling, or other means known in the art to increase the surface area to which contact can be made.

A semiconductor device comprising the invention could conceivably be attached along with other devices to a printed circuit board, for example to a computer motherboard or as a part of a memory module used in a personal computer, a minicomputer, or a mainframe. The inventive device could further be useful in other electronic devices related to telecommunications, the automobile industry, semiconductor test and manufacturing equipment, consumer electronics, or virtually any piece of consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method for forming a semiconductor device comprising:
    electrically coupling each conductive pad of a plurality of conductive pads located on a major surface of a semiconductor wafer section with an elongated electrical interconnect;
    encasing each said electrical interconnect in a dielectric;
    sectioning said dielectric and exposing a portion of each said interconnects; and
    severing said electrical interconnect subsequent to encasing each said electrical interconnect in said dielectric, wherein said sectioning of said dielectric comprises etching said dielectric, and said severing of said electrical interconnect comprises etching electrical interconnects.

2. A method for forming a semiconductor device comprising:
    electrically coupling each conductive pad of a plurality of conductive pads located on a major surface of a semiconductor wafer section with an elongated electrical interconnect;
    encasing each said electrical interconnect in a dielectric; and
    sectioning said dielectric, severing said interconnect to expose a portion of each said interconnect, and severing said wafer section during a single severing step.

3. A method for forming a semiconductor device comprising:
    attaching a first end of each of a plurality of one-piece elongated electrical interconnections to one of a plurality of bond pads located on a major surface of a semiconductor wafer section;
    encasing said electrical interconnection and at least a portion of said major surface in a dielectric;
    exposing a second end of each said interconnection such that said second end of each said electrical interconnection is free from said dielectric and does not extend beyond a lateral perimeter of said wafer section; and
    severing each said interconnection to expose each said second end, and forming a generally planar surface of each said second end during said severing.

4. A method for forming a semiconductor device comprising:
    contacting and electrically coupling a first end of each of a plurality of conductive bond wires with one conductive bond pad of a plurality of conductive bond pads located on a major surface of a semiconductor wafer section, wherein said major surface intersects a generally planar surface of said semiconductor wafer section;
    subsequent to electrically coupling each said bond wire with one of said bond pads, encasing said plurality of bond wires in a dielectric; and
    exposing a second end of each said bond wire at a generally planar dielectric surface of said dielectric, wherein said generally planar dielectric surface intersects said major surface of said wafer section and generally forms a right angle therewith.

5. The method of claim 4 further comprising forming said dielectric to cover said major surface of said wafer section in its entirety during said encasing of said plurality of bond wires in said dielectric.

6. A method for forming a semiconductor device comprising:
    contacting and electrically coupling a first end of each of a plurality of conductive interconnects with one conductive pad of a plurality of conductive pads located on a major surface of a semiconductor wafer section, wherein said major surface intersects a generally planar surface of said semiconductor wafer section;
    subsequent to electrically coupling each said interconnect with one of said pads, encasing said plurality of interconnect in a dielectric;
    removing a portion of said dielectric to form a generally planar dielectric surface and to expose a second end of each said interconnect at said generally planar dielectric surface of said dielectric, wherein said generally planar dielectric surface intersects said major surface of said wafer section and generally forms a right angle therewith; and
    during said removing of said portion of said dielectric, removing a portion of each said conductive interconnect second end to form a generally planar interconnect surface which is generally coplanar with said generally planar surface of said dielectric.

7. A method for forming a semiconductor device comprising:
    providing a semiconductor wafer section having a circuit side with a plurality of conductive pads thereon and a back side opposite said circuit side;
    providing a plurality of conductive interconnects each having a first end and a second end;
    contacting each said first end of each said interconnect with one of said conductive pads such that said second end of each said interconnect does not extend beyond a lateral perimeter defined by said wafer section and such that each said first and second end of each said interconnect are on one side of a plane defined by said circuit side of said wafer section;
    encasing said plurality of interconnects in an encapsulation material; and
    removing a portion of said encapsulation material to expose said second end of each said interconnect and to result in said second ends of said interconnects protruding from said encapsulation material.

8. The method of claim 7 further comprising heating each said protruding second end to form rounded contacts.

9. A method for forming a semiconductor device comprising:
   electrically coupling each conductive pad of a plurality of conductive pads located on a major surface of a semiconductor wafer section with an elongated electrical interconnect;
   encasing all exposed portions of each said electrical interconnect in a dielectric; and
   removing a portion of said dielectric to expose a portion of each said interconnect.

10. The method of claim 9 wherein said electrical coupling of each said pad with said interconnect further comprises attaching a bond wire to a bond pad.

11. The method of claim 9 wherein said encasing of each said electrical interconnect in dielectric further comprises encasing said electrical interconnect in a dielectric selected from the group consisting of polyimide, epoxy, room-temperature vulcanizing rubber, benzocyclobutene, and silicone gel.

12. The method of claim 9 further comprising severing said electrical interconnect subsequent to said encasing of each said electrical interconnect in said dielectric.

13. The method of claim 12 wherein said removal of said portion of said dielectric comprises cutting said dielectric, and said severing of said electrical interconnect comprises cutting said electrical interconnects.

14. The method of claim 12 wherein said removal of said portion of said dielectric comprises etching said dielectric, and said severing of said electrical interconnect comprises etching electrical interconnects.

15. The method of claim 9 further comprising severing said wafer section.

16. The method of claim 9 wherein said removal of said portion of said dielectric further comprises severing said wafer section during said removal of said portion of said dielectric.

17. The method of claim 16 wherein said removal of said portion of said dielectric and said severing of said wafer section further comprises severing said interconnect.

18. A method for forming at least one semiconductor device, comprising:
   attaching a first end of an electrical interconnect to a first conductive pad on a major surface of a wafer section;
   attaching a second end of said electrical interconnect to a second conductive pad on said major surface of said wafer section;
   subsequent to attaching said first and second ends of said electrical interconnect to said first and second conductive pads, encasing said electrical interconnect and at least a portion of said major surface of said wafer section in a dielectric layer; and
   severing said dielectric layer, said electrical interconnect, and said wafer section to form said at least one semiconductor device.

19. A method for forming at least one semiconductor device, comprising:
   attaching a first end of a bond wire to a first bond pad on a major surface of a wafer section;
   attaching a second end of said bond wire to a second bond pad on said major surface of said wafer section;
   subsequent to attaching said first and second ends of said bond wire to said first and second bond pads, encasing said bond wire and at least a portion of said major surface of said wafer section in a dielectric layer; and
   severing said dielectric layer, said bond wire, and said wafer section to form said at least one semiconductor device.

20. A method for forming at least one semiconductor device, comprising:
   attaching a first end of a first electrical interconnect to a first conductive pad on a major surface of a wafer section and attaching a second end of said first electrical interconnect to a kerf area of said wafer section;
   attaching a first end of a second electrical interconnect to a second conductive pad on said major surface of said wafer section and attaching a second end of said second electrical interconnect to said kerf area of said wafer section;
   subsequent to attaching said first and second electrical interconnects to said conductive pads and to said kerf area, encasing said first and second electrical interconnects, at least a portion of said major surface of said wafer section in a dielectric layer; and
   severing said dielectric layer, said electrical interconnects, and said wafer section to form said at least one semiconductor device.

21. A method for forming at least one semiconductor device, comprising:
   attaching a first end of a first bond wire to a first bond pad on a major surface of a wafer section and attaching a second end of said first bond wire to a kerf area of said wafer section;
   attaching a first end of a second bond wire to a second bond pad on said major surface of said wafer section and attaching a second end of said second bond wire to said kerf area of said wafer section;
   subsequent to attaching said first and second bond wires to said bond pads and to said kerf area, encasing said first and second bond wires, at least a portion of said major surface of said wafer section in a dielectric layer; and
   severing said dielectric layer, said bond wire, and said wafer section to form said at least one semiconductor device.

22. A method for forming a semiconductor device comprising:
   providing a semiconductor wafer section comprising first and second unsingularized semiconductor dies each having a circuit side with a plurality of conductive pads thereon and a back side opposite said circuit side;
   providing a plurality of conductive interconnects each having a first end and a second end;
   contacting each said first end of each said interconnect with one of said conductive pads such that said second end of each said interconnect does not extend beyond a lateral perimeter defined by said wafer section and such that each said first and second end of each said interconnect are on one side of a plane defined by said circuit side of said wafer section;
   encasing said plurality of interconnects in an encapsulation material;
   cutting said wafer section to segment said wafer section into a first section comprising said first semiconductor die and a second segment comprising said second semiconductor die;
   cutting said encapsulation material to form a generally planar surface and to expose said second end of each said interconnect; and cutting each said electrical interconnect such that each said interconnect is exposed at said generally planar surface of said encapsulation material, wherein said cutting of said wafer section, said encapsulation material, and each said interconnect is performed using a water jet.

23. A method for forming a semiconductor device comprising:

providing a semiconductor wafer section having a circuit side with a plurality of conductive pads thereon and a back side opposite said circuit side;

providing a plurality of conductive interconnects each having a first end and a second end;

contacting each said first end of each said interconnect with one of said conductive pads such that said second end of each said interconnect does not extend beyond a lateral perimeter defined by said wafer section and such that each said first and second end of each said interconnect are on one side of a plane defined by said circuit side of said wafer section;

encasing said plurality of interconnects in an encapsulation material by forming said encapsulation material only on said circuit side of said wafer section such that each said interconnect resides wholly on one side of said plane defined by said circuit side of said wafer section; and removing a portion of said encapsulation material to expose said second end of each said interconnect.

24. The method of claim 23 further comprising cutting said wafer, cutting said encapsulation material, and cutting each said interconnect during a single pass through a saw.

25. A method for forming a semiconductor device comprising:

providing a semiconductor wafer section comprising first and second unsingularized semiconductor dies each having a circuit side with a plurality of conductive pads thereon and a back side opposite said circuit side;

providing a plurality of conductive interconnects each having a first end and a second end;

contacting each said first end of each said interconnect with one of said conductive pads such that said second end of each said interconnect does not extend beyond a lateral perimeter defined by said wafer section and such that each said first and second end of each said interconnect are on one side of a plane defined by said circuit side of said wafer section;

encasing said plurality of interconnects in an encapsulation material;

etching said encapsulation material to form a generally planar surface and to expose said second end of each said interconnect;

etching each said interconnect such that each said interconnect is exposed at said generally planar surface of said encapsulation material and etching said wafer section to segment said wafer section into a first section comprising said first semiconductor die and a second segment comprising said second semiconductor die.

* * * * *